US010608267B2

(12) United States Patent
Dimble et al.

(10) Patent No.: US 10,608,267 B2
(45) Date of Patent: Mar. 31, 2020

(54) LOW TEMPERATURE CO-FIRED CERAMIC SUBSTRATE MINIATURE FUEL CELL AND MANUFACTURING THEREFOR

(71) Applicants: Secretary, Department of Electronics of Information Technology (Deity) Ministry of Communications and Information Technology, New Delhi (IN); Executive Director General, Centre For Materials For Electronics Technology, Pune, Maharashtra (IN)

(72) Inventors: Shekhar Dimble, Maharashtra (IN); Shrikant Kulkarni, Maharashtra (IN); Ramesh Pushpangadan, Maharashtra (IN); Tarkeshwar Patil, Maharashtra (IN); Girish Phatak, Maharashtra (IN); Siddhartha Duttagupta, Maharashtra (IN)

(73) Assignees: Secretary, Department of Electronics and Information Technology (Deity) Ministry of Communications and Information Technology, New Delhi (IN); Executive Director General, Centre for Materials for Electronics Technology, Pune, Maharashtra (IN)

( * ) Notice: Subject to any disclaimer, the term of this patent is extended or adjusted under 35 U.S.C. 154(b) by 169 days.

(21) Appl. No.: 15/552,267

(22) PCT Filed: Jan. 13, 2016

(86) PCT No.: PCT/IB2016/050134
§ 371 (c)(1),
(2) Date: Aug. 18, 2017

(87) PCT Pub. No.: WO2016/132235
PCT Pub. Date: Aug. 25, 2016

(65) Prior Publication Data
US 2018/0069252 A1    Mar. 8, 2018

(30) Foreign Application Priority Data

Feb. 21, 2015   (IN) .............................. 495/DEL/2015

(51) Int. Cl.
*H01M 8/0432*   (2016.01)
*H01M 8/0215*   (2016.01)
(Continued)

(52) U.S. Cl.
CPC ....... *H01M 8/04365* (2013.01); *H01M 8/006* (2013.01); *H01M 8/026* (2013.01);
(Continued)

(58) Field of Classification Search
CPC ............ H01M 8/04365; H01M 8/006; H01M 8/0215; H01M 8/0228; H01M 8/026;
(Continued)

(56) References Cited

U.S. PATENT DOCUMENTS 5,312,675 A * 5/1994 Cooper .................... B32B 7/02
  428/215
5,683,535 A * 11/1997 Karr .................... B32B 37/0023
  156/285
(Continued)

FOREIGN PATENT DOCUMENTS

KR    20120088240 A  *  8/2012

OTHER PUBLICATIONS

ISA/IN, International Search Report for Int'l Appln No. PCT/IB2016/050134, dated Apr. 27, 2016, 1 pg.

*Primary Examiner* — Gregg Cantelmo
(74) *Attorney, Agent, or Firm* — Umberg Zipser LLP

(57) ABSTRACT

A low temperature co-fired ceramic substrate miniature fuel cell and manufacturing method therefor is disclosed. The method can be used for rapid, flexible and precise fabrication of gas distribution network as well as for a conventional
(Continued)

membrane electrode assembly, for providing high power density. The construction results in a light weight assembly offering 5 optimum cavity for robust set-up and planar series configuration as compared to other established methods of fabrication.

6 Claims, 4 Drawing Sheets

(51) Int. Cl.
  *H01M 8/0228* (2016.01)
  *H01M 8/026* (2016.01)
  *H01M 8/04007* (2016.01)
  *H01M 8/00* (2016.01)
  *H01M 8/1039* (2016.01)
  *H01M 8/1018* (2016.01)
  *H05K 1/02* (2006.01)
  *H05K 3/46* (2006.01)

(52) U.S. Cl.
  CPC ....... *H01M 8/0215* (2013.01); *H01M 8/0228* (2013.01); *H01M 8/04037* (2013.01); *H01M 8/1018* (2013.01); *H01M 8/1039* (2013.01); *H01M 2008/1095* (2013.01); *H01M 2250/30* (2013.01); *H05K 1/0272* (2013.01); *H05K 3/4629* (2013.01); *Y02B 90/18* (2013.01); *Y02P 70/56* (2015.11)

(58) Field of Classification Search
  CPC ........... H01M 8/04037; H01M 8/1018; H01M 8/1039; H01M 2008/1095; H01M 2250/30; H05K 1/0272; H05K 3/4629
  See application file for complete search history.

(56) References Cited

U.S. PATENT DOCUMENTS

| | | | |
|---|---|---|---|
| 6,592,696 B1* | 7/2003 | Burdon | B01J 19/0093 156/219 |
| 6,960,403 B2* | 11/2005 | Morse | H01M 4/8605 429/434 |
| 2003/0064275 A1* | 4/2003 | Morse | H01M 8/241 429/535 |
| 2005/0241128 A1* | 11/2005 | Berry | H01L 21/481 29/25.41 |
| 2007/0243447 A1* | 10/2007 | Jang | H01M 8/2483 429/457 |
| 2007/0275277 A1 | 11/2007 | Peng et al. | |

* cited by examiner

LOW TEMPERATURE CO-FIRED CERAMIC SUBSTRATE MINIATURE FUEL CELL AND MANUFACTURING THEREFOR

FIELD OF DISCLOSURE

The present disclosure relates to fuel cells, particularly to a low temperature co-fired ceramic (LTCC) substrate miniature fuel cell and manufacturing method therefor.

DEFINITIONS

As used in the present disclosure, the following words and phrases are generally intended to have the meaning as set forth below, except to the extent that the context in which they are used to indicate otherwise.
PEM—Polymer Electrolyte Membrane
GDL—Gas Diffusion Layer
MEA—Membrane Electrode Assembly
LTCC—Low Temperature Co-fired Ceramic
GDN—Gas Distribution Network
PCB—Printed Circuit Board

BACKGROUND

As the functionality of handheld electronic gadgets, mobiles and laptops increases day by day, and the development of battery technology is limited, there is a need for possible power sources that can efficiently power-up these gadgets. Even though batteries are most commonly used, they suffer from long recharge time and limited recharge cycles, leading to the generation of electronic waste and environmental impact. PEM fuel cells have high energy density (typically, 500 mW/cm$^2$) and can be refuelled immediately with low environmental impact as compared to batteries. They can be operated at about 50° C. Fuel cell systems for portable applications require both passive components such as heaters and thermistors as well as mechanical components such as valves and pressure sensors, and also electronics to operate them. This makes the overall power systems bulky for use in modern gadgets. The fuel cell consists of an MEA, bipolar plates and a GDL. The MEA is responsible for the electrochemical operation of the cell; the bipolar plates contain a flow field which provides fuel to the MEA and conductive electronic paths. The GDL ensures uniform distribution of the fuel to the MEA. The current is produced at the electrodes and collected by the bipolar plates. The bipolar plates, which are made up of graphite, contribute significantly towards the weight and size of a PEM fuel cell assembly and hence cannot be considered for embedding in portable applications. The conventional approach to reduce the cell dimensions is to fabricate the entire assembly including MEA in silicon technology. This increases the overall cost and provides very low power density.

Hence, a method is needed to fabricate the bipolar plates using a technology which can embed the passive mechanical components as well as the necessary electronics to operate them.

Further, there is a need for a method that has a low development time and that can be used with the conventional MEA to provide higher power density.

OBJECTS

Some of the objects of the present disclosure, which at least one embodiment herein satisfies, are as follows:

An object of the present disclosure is to provide a low temperature co-fired ceramic substrate miniature fuel cell and manufacturing method therefor.

Another object of the present disclosure is to provide a low temperature co-fired ceramic substrate miniature fuel cell that consists of a compatible heater and a compatible thermistor.

Another object of the present disclosure is to provide a method of sealing of fuel cell under high pressure and low temperature without damaging the fuel cell assembly.

Another object of the present disclosure is to provide an economical and less time consuming method of precise GDN fabrication.

Yet another object of the present disclosure is to provide a method for constructing miniature fuel cells having high power density.

Another object of the present disclosure is to provide a method for establishing flexibility of routing of better electrical interconnects without damaging the MEA.

Another object of the present disclosure is to provide a method for reducing the size or bulk of the fuel cell that is suitable for portable applications.

Other objects and advantages of the present disclosure will be more apparent from the following description which is not intended to limit the scope of the present disclosure.

SUMMARY

A multi-layer ceramic substrate miniaturized polymer electrolyte membrane fuel cell and manufacturing method therefor is disclosed.

A low temperature co-fired ceramic substrate miniature fuel cell comprising at least one anode module, at least one cathode module and a membrane sandwiched between the anode module and the cathode module; characterized in that each of the anode module and the cathode module comprises the following low temperature co-fired ceramic layers:
  at least one first layer in contact with the membrane and having a cavity formed thereon, wherein a wall of the cavity is coated with a catalyst for electrochemical reaction;
  at least one second layer in contact with the first layer and having a gas manifold comprising at least one channel formed thereon for effective distribution of gaseous fuel and oxidant in the cell;
  at least one third layer in contact with the second layer for supporting the gas manifold formed in the second layer;
  at least one fourth layer in physical and thermal contact with the third layer, the fourth layer comprising a resistive heating element and a temperature sensor in the form of a thermistor configured thereon; and
  at least one fifth layer in contact with the fourth layer, the fifth layer separating the fourth layer from the ambient environment;

An electrical connection is formed through vias extending inwardly through each of the layers for configuring an electrical path from the membrane to the fifth layer for facilitating flow of current from the membrane to an output load. There is an inlet conduit and an outlet conduit formed through the layers to facilitate supply of a fuel to the second layer and to facilitate removal of reaction products from the cavity respectively. The membrane used in the miniature fuel cell is a sulphonated tetrafluoroethylene with active ternary metal ions therein.

A method for manufacturing a low temperature co-fired ceramic (LTCC) substrate miniature fuel cell is disclosed and involves the following steps:

a. providing LTCC substrate;
b. providing patterns for layers of the fuel cell, to be formed on the LTCC substrates;
c. forming the patterns onto the LTCC substrates to obtain the following LTCC substrate layers: at least one first layer having a cavity formed thereon; at least one second layer having a gas manifold comprising one channel formed thereon for transferring heat to the gas; at least one third layer for separating the gas manifold formed in the second layer; at least one fourth layer comprising a resistor heating element and a thermistor configured thereon; and at least one fifth layer for separating the fourth layer from ambient environment;
d. forming vias extending inwardly through the layers for configuring electrical contacts; an inlet conduit through the layers to facilitate supply of a fuel to said second layer; and an outlet conduit formed through the layers to facilitate removal of reaction products from said cavity;
e. stacking the layers so that the vias, the inlet conduit and the outlet conduits register with each other thereby forming a vias, an inlet conduit and an outlet conduit, wherein a pressure in the range from 5 MPa to 10 MPa is applied and the temperature of each of the five layers is in the range from 55° C. to 60° C.;
f. laminating the stacked layers using an iso-static laminator by pressurizing the stacked layer in the pressure range from 20 MPa to 25 MPa and a temperature in the range from 65° C. to 75° C.;
g. co-firing the laminated stacked layer at a temperature of 870° C. to 880° C. so as to obtain a module for an anode;
h. repeating steps (a) to (g) to obtain a cathode module;
i. providing a membrane;
j. sandwiching the membrane between one anode module and one cathode module such that the first layer of each of the anode module and the cathode module is in contact with the membrane to obtain an assembly;
k. wrapping the assembly in a polymer film by heating the assembly wrapped in the polymer film at a temperature range from 95° C. to 105° C. to obtain a fuel cell.

DETAILED DESCRIPTION

Figure 1:
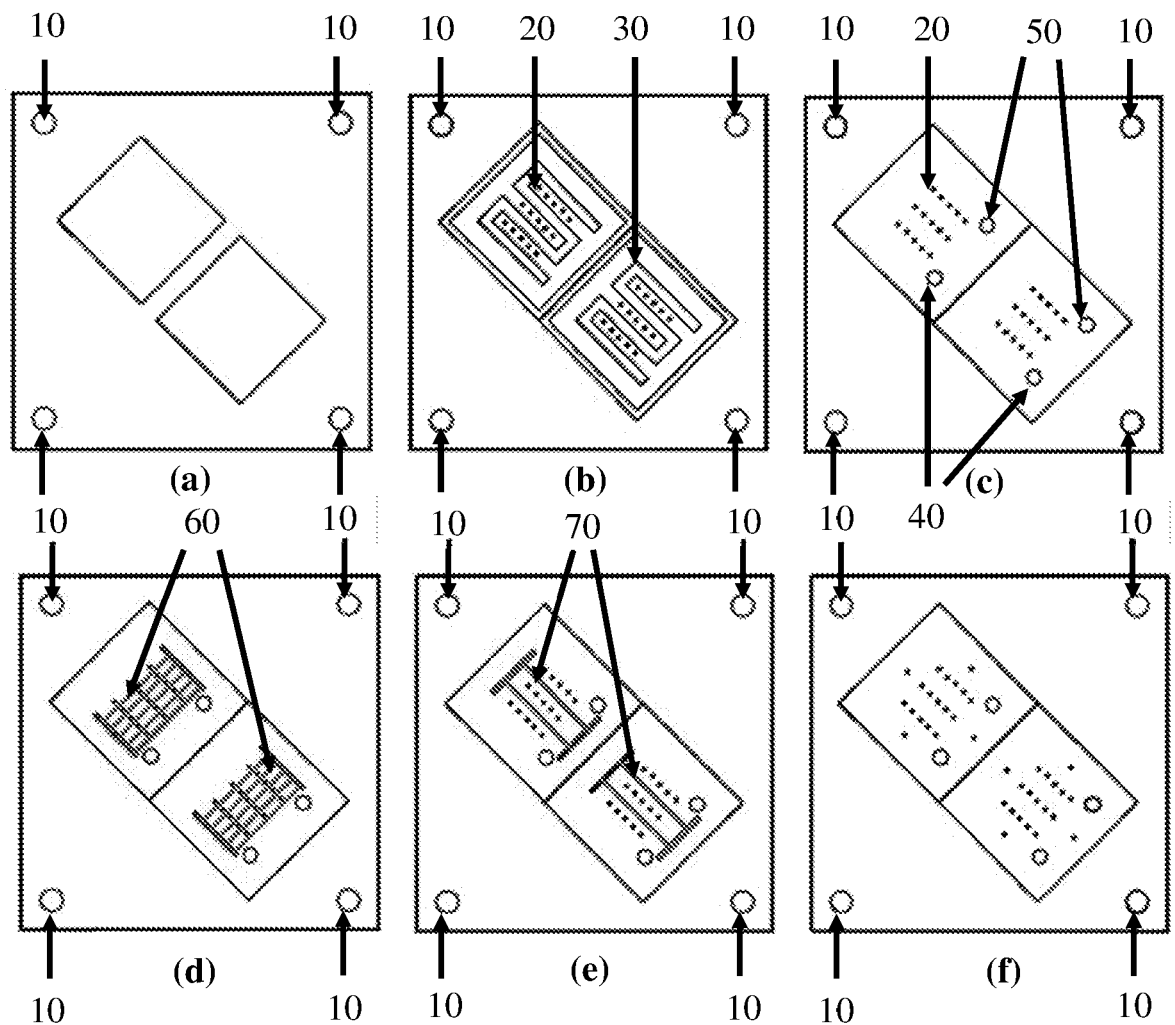
FIGS. 1(a), 1(b), 1(c), 1(d), 1(e) and 1(f) illustrate layer-by-layer design of the fuel cell using LTCC layers.

A preferred embodiment will now be described in detail. The preferred embodiment does not limit the scope and ambit of the disclosure. The description provided is purely by way of example and illustration.

The embodiment herein and the various features and advantageous details thereof are explained with reference to the non-limiting embodiment in the following description. Description of well-known components and processing techniques are omitted so as to not unnecessarily obscure the embodiment herein. The examples used herein are intended merely to facilitate an understanding of ways in which the embodiment herein may be practiced and to further enable those of skill in the art to practice the embodiment herein. Accordingly, the example should not be construed as limiting the scope of the embodiment herein.

In accordance with the present disclosure, the invention herein describes a multi-layer ceramic substrate miniaturized polymer electrolyte membrane fuel cell and manufacturing method therefor. In accordance with one embodiment, two modules of LTCC structure are prepared (see FIG. 1) forming an anode and a cathode of the fuel cell, which are then bonded together after placing the MEA (Membrane Electrode Assembly) in between. A resistive heating element is included in the package to heat the MEA. In an exemplary embodiment (see FIG. 3 and FIG. 4), each module comprises eight layers: Two layers form a cavity for the MEA (L1 & L2), another two layers have gas manifolds (L3 & L4), one gas manifold support layer (L5), a resistive heater layer (L6), a temperature sensor layer (L7), in the form of thermistor and at least one layer (L8) at the bottom to support the entire structure. Each module is formed by aligning and stacking these layers in series by means of four alignment holes provided at the corners of each layer. Vertical gas feed-throughs provide a passage for the humidified gas over the MEA. The current generated by the MEA is collected by means of a conducting layer printed in the space between the channels on the manifold layers and is taken to the outer surface by means of electrical feed-throughs provided on each layer.

The membrane electrode assembly consists of the thin polymer sheet made up of sulfonated tetrafluoroethylene (NAFION™) with a small amount of ternary metal ions to enable ion hopping in electrolytes. The electrode consists of a 0.25 nm layer of platinum sputtered on a carbon tape, which is useful for catalytic activity at the cathode and anode end.

The package material comprises LTCC green tapes consisting of glass-ceramic composite having 50 weight % of alumina and 47 weight % of glass and the rest of the weight is in the form of organic binders and/or additives. The constituting materials for the above-mentioned glass are mainly silica, bismuth oxide, boron oxide, phosphorous pentoxide, lead oxide etc. The green tape contains organic binders, which holds the ceramic material together and also provides softness to the tape. The ceramic material in its soft state before processing is referred to as green tape. These tapes are available in various thicknesses ranging from 50 μm to 250 μm. Electrical interconnections can be formed by making vias by using various techniques such as CNC milling, Laser drilling and cutting, mechanical via punching. Green tapes are layered and stacked together where one or more layers can contain passive components such as heater element, temperature sensors etc.

In one embodiment of the present invention, a low temperature co-fired ceramic substrate miniature fuel cell is disclosed. The miniature fuel cell comprises one anode module, one cathode module and a membrane sandwiched between the anode module and the cathode module; and is characterized in that each of the anode module and the cathode module comprises the following low temperature co-fired ceramic layers with uniform thickness:

at least one first layer in contact with the membrane and having a cavity formed thereon, wherein a wall of the cavity is coated with a catalyst for electrochemical reaction;

at least one second layer in contact with the first layer and having a gas manifold comprising at least one channel formed thereon for effective distribution of gas fuel and oxidant in the cell;

at least one third layer in contact with the second layer for supporting the gas manifold formed in said second layer;

at least one fourth layer in physical and thermal contact with the third layer, the fourth layer comprising a resistive heating element and a temperature sensor in the form of a thermistor configured thereon; and at least one fifth layer in contact with the fourth layer, the fifth layer separating the fourth layer from the ambient environment;

An electrical connection is formed through vias extending inwardly through the layers for configuring an electrical path and facilitating flow of current from the membrane to an output load.

An inlet conduit and an outlet conduit are formed through the layers to facilitate supply of a fuel and to facilitate removal of reaction products respectively from the fuel cell.

FIGS. 1(a)-1(e) illustrate patterned layers used to fabricate the miniature fuel cell. Each layer contains two patterns, one for the fabrication of the anode side module and the other for the fabrication of the cathode side module.

FIG. 1(a) shows the first layer of green ceramic tape, which forms the cavity necessary for the placement of the MEA. The thickness of the cavity is about 400 µm whereas the thickness of the MEA is about 550 µm. The cavity thickness is kept lower than MEA to avail compression of the MEA in the package. It also comprises four alignment holes 10 at the corners. More that one such layers can be used to increase the depth of the cavity.

FIG. 1(b) illustrates the second layer, a gas manifold layer in which a serpentine pattern 30 for gas flow field is cut through. These layers also comprise electrical feed-throughs 20 and four alignment holes 10. The electrical feed-throughs serve to collect the current generated by the fuel cell. More than one such layers can be stacked together to increase the manifold depth.

FIG. 1(c) shows the third layer, a gas manifold support layer which contains electrical feed-throughs 20 which communicates with the upper gas manifold layer and has four alignment holes. In addition, it also comprises gas inlet holes 40 and outlet holes 50 communicating to the ends of flow channels on the upper gas manifold layer.

FIG. 1(d) shows a heater layer which is aligned with the upper gas manifold support layer with alignment holes. It comprises a ladder type thick film heater 60 and electrical feed-throughs. Gas inlet holes and outlet holes are also placed on this layer.

FIG. 1 (e) illustrates a layer consisting of a temperature sensor in the form of thermistor 70. This thermistor is screen printed thick film paste having $CoRuO_3$ as a constituent material.

The heater layer and the thermistor layer, as shown in FIG. 1(d) and FIG. 1(e), together constitute the fourth layer.

FIG. 1(f) illustrates the fifth layer, which is the last layer of the package and which acts as a support layer for the package. One or more such layers can be stacked together to increase the support.

The current generated by the MEA is taken to an external load via the electrical feed-throughs. Power is supplied to the heater by means of electrical feed-throughs which contacts the heater on the upper layer.

Figure 2:
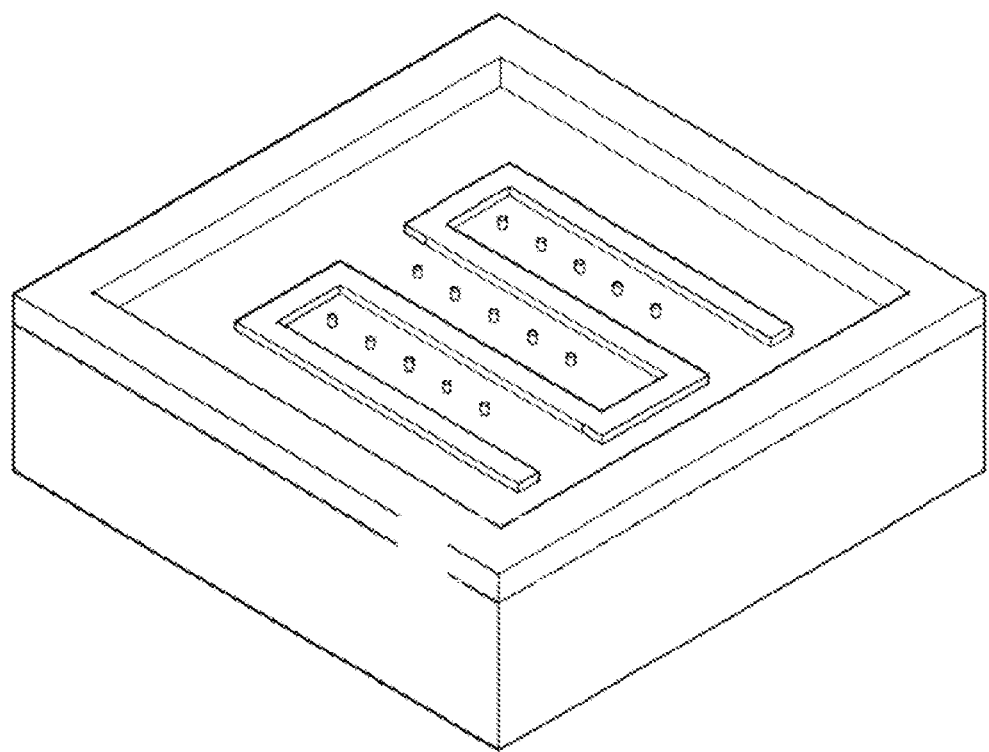
FIG. 2 shows an oblique view of fuel the cell after stacking of LTCC layers.

FIG. 2 shows a perspective view of the half section of a PEM fuel cell package where the package is sliced open to show the serpentine channel structure. This channel structure is supported on the plurality of LTCC layers. A cavity is formed by multiple LTCC layers on the top surface above the channel structure for the placement of the MEA. Electrical connections are taken through vias from the electrodes of the MEA to the outer top surface of the structure. FIG. 2 also illustrates the packaging of the MEA wherein a cavity is formed in the stack of the LTCC layers, which are bonded together by means of a parallax sheet placed on the cavity.

Figure 3:
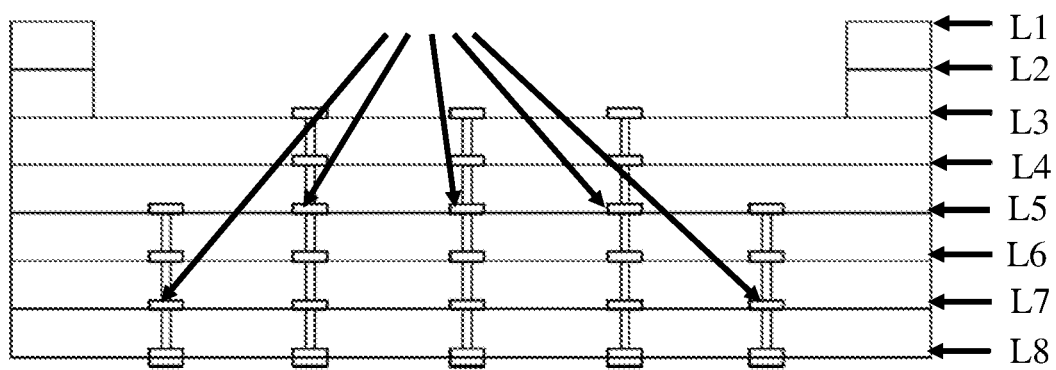
FIG. 3 illustrates a side view of the LTCC substrate fuel cell showing metallic interconnections (I) from top to bottom to collect and draw the current produced at the cell electrodes.

FIG. 3 illustrates a cross-sectional view of the half section of a fuel cell package in accordance with one embodiment of the present disclosure, wherein some of the layers are replicated and bonded together to provide additional thickness and support. FIG. 3 shows metallic interconnections (I) from top to bottom, to collect and draw the current produced at the cell electrodes and electrical connections through the multiplicity of layers (L1-L8) of the LTCC substrate, as well as electrical connections from the heater and the thermistor incorporated through the multiplicity of layers of the LTCC substrate. FIG. 3 also shows a cavity for the placement of the MEA. The thickness of the MEA decides the depth of the cavity, which is formed so as to compress the MEA to make contact with the gas channel layer. The top two layers L1 & L2 form a cavity for the placement of the MEA; layers L3 & L4 have a gas manifold comprising at least one channel formed thereon for effective distribution of gaseous fuel and oxidant in the cell; layer L5 supports the gas manifold layers; layer L6 comprises a resistive heating element; layer L7 comprises a temperature sensor in the form of a thermistor; and at the bottom, one layer L8 supports the entire structure and separates layer L7 from the ambient environment.

Figure 4:
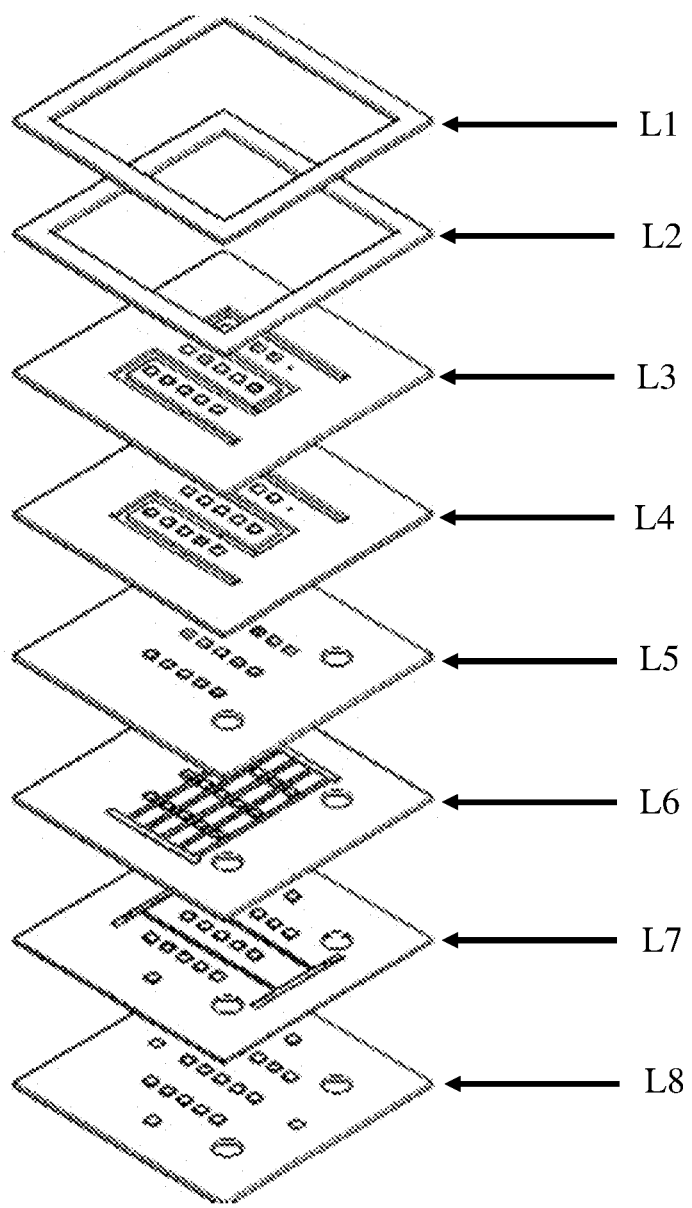
FIG. 4 Shows an oblique view of stacked layer order in the LTCC substrate fuel cell in which GDL is sandwiched from both the sides and sealed firmly.

FIG. 4 shows the arrangement of the layers shown in FIG. 3 for the half section of the package. The top two layers L1 & L2 are stacked together to form the cavity for the placement of the MEA. Layer L6 has a resistive ladder type heater pattern printed on it while layer L7 has a temperature sensor in the form of a thermistor printed on it. All the layers can be stacked together before cutting the flow channels through them. The total assembly containing eight layers L1-L8 is stacked together by hot pressing them at a temperature of about 60° C. in a stainless steel fixture.

A miniature fuel cell can be formed by using carbon paper as a gas diffusion layer. The fuel and air is supplied by the serpentine manifolds formed in LTCC layers, which remove the water effectively, thereby avoiding the flooding in the fuel cell.

In another embodiment, a method for manufacturing a low temperature co-fired ceramic substrate miniature fuel cell is disclosed. The LTCC substrates are provided in the form green tape. The tape used in in an exemplary embodiment is 250 µm thick LTCC green tape (DUPONT 951™). The required patterns of layers of the fuel cell are formed on the LTCC substrates. The pattern transfer can be achieved by using suitable techniques selected from CNC milling, laser drilling, laser cutting and mechanical punching, etc. The patterns on the LTCC substrates are formed to obtain the following LTCC substrate layers:

at least one first layer having a cavity formed thereon;

at least one second layer having a gas manifold comprising channels formed thereon for effective distribution of gaseous fuel and oxidant in the fuel cell;

at least one third support layer for supporting the gas manifold formed in the second layer;

at least one fourth layer comprising a resistive heating element and a temperature sensor in the form of a thermistor configured thereon; and at least one fifth separator layer for separating the fourth layer from the ambient environment.

As per the design requirements, some of the above-mentioned layers can be replicated and bonded together to form a layer providing additional thickness and support.

The vias are then formed which extend inwardly through each of the above-mentioned layers for configuring conduits. An inlet conduit and an outlet conduit are formed through the layers so as to facilitate supply of gaseous fuel and to facilitate removal of electrochemical reaction products from the cell respectively. The vias are then filled using a silver (Ag) paste (DUPONT 6142D™). These vias are used for establishing an electrical contact from the top to the bottom of the layers and can be used for collecting the produced current.

These vias are then covered by an Ag—Pd paste (solderable conductor). The resistor heating element, which is specifically meant to provide the operating temperature, is then coated using a $CoRuO_3$ paste (DUPONT CF011™). In an exemplary embodiment, the vias size is about 200 μm wide and 200 μm in length whereas the pad size (printed using silver paste) is 400 μm wide and 400 μm long. A temperature sensor in the form of a thermistor is formed using (DUPONT 5092D™) to measure heat and control the power source to the heating element. This is achieved in the Screen/Stencil Printer with video alignment facility.

The layers thus formed are then stacked so that the vias, the inlet conduits and the outlet conduits register with each other thereby forming a vias, an inlet conduit and an outlet conduit. The stacking of aligned layers is achieved by applying a pressure in the range from 5 MPa to 10 MPa at a temperature in the range from 55° C. to 60° C.

The stacked layers are then laminated using an iso-static laminator by pressurizing the laminated stacked layer in the pressure range from 20 MPa to 25 MPa and at a temperature in the range from 65° C. to 75° C.

The laminated stacked layers are then co-fired in a thick film batch furnace at a temperature of 870° C. to 880° C. so as to obtain a module for an anode. Similarly, a cathode module is formed by using the same number of layers, and by using the above-mentioned method.

A membrane is then sandwiched between the anode and the cathode modules such that the first layer of the anode module and the cathode module is in contact with the membrane to obtain an assembly. The membrane assembly thus formed is wrapped in a polymer adhesive film of parallax and bonded together by heating the wrapped assembly at a temperature range from 95° C. to 105° C.

Technical Advancements

The method for constructing miniaturized PEM fuel cells using LTCC technology, in accordance with the present disclosure has several technical advantages including but not limited to the realization of:

an economical and time saving method of fabrication as compared to silicon technology;
series (to boost voltage) and/or parallel (to boost current) connections of more than one fuel cell is possible;
easy scalability of the fuel cell from micro to medium size without increasing the thickness of the package;
uses carbon paper as a gas diffusion layer, hence the package requires no additional GDL;
the fuel and air are supplied by serpentine manifolds formed on the LTCC layers which are provided for efficient removal of water thereby avoiding flooding in the fuel cell;
a leak proof bonding of anodic and cathodic parts of the package with a PEM fuel cell using a polymer sheet;
avoiding the use of external nut-bolts contributing to the bulk of the package;
good electrical contacts between fuel cell and current collector can be established by pressing MEA after sealing the cavity; and
light weight and robust package can be constructed in less development time.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps. The use of the expression "at least" or "at least one" suggests the use of one or more elements or ingredients or quantities, as the use may be in the embodiment of the invention to achieve one or more of the desired objects or results.

Any discussion of documents, acts, materials, devices, articles or the like that has been included in this specification is solely for the purpose of providing a context for the invention. It is not to be taken as an admission that any or all of these matters form part of the prior art base or were common general knowledge in the field relevant to the invention as it existed anywhere before the priority date of this application.

Wherever a range of values is specified, a value up to 10% below and above the lowest and highest numerical value respectively, of the specified range, is included in the scope of the disclosure. The numerical values mentioned for the various physical parameters, dimensions or quantities are only approximations and it is envisaged that the values higher/lower than the numerical values assigned to the parameters, dimensions or quantities fall within the scope of the disclosure, unless there is a statement in the specification specific to the contrary.

While considerable emphasis has been placed herein on the particular features of this invention, it will be appreciated that various modifications can be made, and that many changes can be made in the preferred embodiment without departing from the principles of the invention. These and other modifications in the nature of the invention or the preferred embodiments will be apparent to those skilled in the art from the disclosure herein, whereby it is to be distinctly understood that the foregoing descriptive matter is to be interpreted merely as illustrative of the invention and not as a limitation.

The invention claimed is:

1. A co-fired multi-layer ceramic substrate fuel cell comprising:
   an anode module;
   a cathode module;
   a membrane electrode assembly (MEA) sandwiched between said anode module and said cathode module;
   characterized in that each of said anode module and said cathode module comprise the following co-fired ceramic layers:
   at least one first layer in contact with said membrane electrode assembly (MEA) and having a cavity formed thereon;
   at least one second layer in contact with said first layer and having a gas manifold comprising at least one channel formed thereon for distribution of gaseous fuel in anode module and oxidant in cathode module of the cell;
   at least one third layer in contact with said second layer for supporting said gas manifold formed in said second layer;

at least one fourth layer in physical and thermal contact with said third layer, said fourth layer comprising a resistive heating element and a temperature sensor in the form of a thermistor configured thereon; and at least one fifth layer in contact with said fourth layer, said fifth layer separating said fourth layer from the ambient environment;

electrical connections formed through vias extending inwardly through each of said first, second, third, fourth and fifth layers for configuring an electrical path from said membrane to said fifth layer for facilitating flow of current from said membrane to an output load;

at least one inlet conduit formed through each of said first, second, third, fourth and fifth layers to facilitate supply of fuel gas to said second layer in anode module of the fuel cell and to facilitate supply of oxidant to said second layer in cathode module of the fuel cell; and at least one outlet conduit formed through said layers to facilitate removal of reaction products from said cavity.

2. The fuel cell as claimed in claim 1, wherein said membrane is a sulphonated tetrafluoroethylene with active ternary metal ions therein.

3. The fuel cell as claimed in claim 1, wherein said layers have at least one of the following features:
thickness of each of said first, second, third, fourth and fifth layers is in the range from 50 μm to 250 μm;
width of each of said first, second, third, fourth and fifth layers is in the range from 18 mm to 25 mm;
length of each of said first, second, third, fourth and fifth layers is in the range from 16 mm to 25 mm;
width of said gas manifold channels is in the range from 0.5 mm to 1 mm; and
length of said gas manifold channels is in the range from 5 mm to 10 mm.

4. A method for manufacturing a co-fired multi-layer ceramic substrate fuel cell as claimed in claimed in claim 1, said method:
a. providing substrates;
b. providing patterns for layers of said fuel cell to be formed on said substrates;
c. forming said patterns onto said substrates to obtain multiple substrate layers, comprising:
at least one first layer having a cavity formed thereon;
at least one second layer having a gas manifold comprising at least one channel formed thereon for distribution of gaseous fuel in anode module of the fuel cell and oxidant in cathode module of the fuel cell;
at least one third layer for supporting said gas manifold formed in said second layer;
at least one fourth layer comprising a resistive heating element and a temperature sensor in the form of a thermistor configured thereon; and
at least one fifth layer for separating said fourth layer from the ambient environment;

d. forming at least one:
vias extending inwardly through each of said at least one first, second, third, fourth and fifth layers for configuring a vias conduit;
inlet conduit formed through each of said at least one first, second, third, fourth and fifth layers to facilitate supply of a gaseous fuel to said second layer; and
outlet conduit formed through said layers to facilitate removal of reaction products from said cavity;

e. stacking said at least one first, second, third, fourth and fifth layers so that said vias, said inlet conduits and said outlet conduits register with each other thereby forming a vias, an inlet conduit and an outlet conduit, wherein a pressure in the range from 5 MPa to 10 MPa is applied and the temperature of each of said at least one first, second, third, fourth, and fifth layers is in the range from 55° C. to 60° C.;

f. laminating said at least one first, second, third, fourth, and fifth stacked layers using an iso-static laminator by pressurizing said stacked layer in the pressure range from 20 MPa to 25 MPa and a temperature in the range from 65° C. to 75° C.;

g. co-firing said at least one first, second, third, fourth, and fifth laminated stacked layers at a temperature of 870° C. to 880° C. so as to obtain a module for an anode;

h. repeating steps (a) to (g) to obtain a cathode module;
i. providing a membrane electrode assembly (MEA);
j. sandwiching said membrane electrode assembly (MEA) between one anode module and one cathode module such that said at least one first layer of each of said anode module and said cathode module is in contact with said membrane electrode assembly (MEA) to obtain an assembly;
k. wrapping said assembly in a polymer film by heating the assembly wrapped in said polymer film at a temperature range from 95° C. to 105° C. to obtain a fuel cell.

5. The method as claimed in claim 4, wherein said membrane electrode assembly (MEA) is sulphonated tetrafluoroethylene with active ternary metal ions therein.

6. The method as claimed in claim 4, wherein said layers have at least one of the following features:
thickness of each of said first, second, third, fourth and fifth layers is in the range from 50 μm to 250 μm;
width of each of each of said first, second, third, fourth and fifth layers is in the range from 18 mm to 25 mm;
length of each of said first, second, third, fourth and fifth layers is in the range from 16 mm to 25 mm;
width of said gas manifold channels is in the range from 0.5 mm to 1 mm; and
length of said gas manifold channels is in the range from 5 mm to 10 mm.

* * * * *